(12) United States Patent
Nagai et al.

(10) Patent No.: US 8,448,917 B2
(45) Date of Patent: May 28, 2013

(54) VACUUM GATE VALVE AND A METHOD OF OPENING AND CLOSING GATE USING THE SAME

(75) Inventors: Hideaki Nagai, Mito (JP); Takashi Hisae, Hitachinaka (JP)

(73) Assignee: V-Tex Corporation, Tokyo (JP)

( * ) Notice: Subject to any disclaimer, the term of this patent is extended or adjusted under 35 U.S.C. 154(b) by 285 days.

(21) Appl. No.: 12/740,424

(22) PCT Filed: Oct. 17, 2008

(86) PCT No.: PCT/JP2008/069292
§ 371 (c)(1), (2), (4) Date: Apr. 29, 2010

(87) PCT Pub. No.: WO2009/057513
PCT Pub. Date: May 7, 2009

(65) Prior Publication Data
US 2010/0327203 A1 Dec. 30, 2010

(30) Foreign Application Priority Data
Nov. 2, 2007 (JP) ................................. 2007-285843

(51) Int. Cl.
*F16K 25/00* (2006.01)
(52) U.S. Cl.
USPC ............................ 251/193; 251/302; 251/327
(58) Field of Classification Search
USPC ................. 251/159, 167, 170, 172, 193, 301, 251/302, 326, 327, 195
See application file for complete search history.

(56) References Cited

U.S. PATENT DOCUMENTS

| | | | | |
|---|---|---|---|---|
| 1,667,690 A | * | 4/1928 | Hamm | 222/512 |
| 1,692,496 A | * | 11/1928 | Frob | 251/167 |
| 1,727,677 A | * | 9/1929 | Siebert, Jr. et al. | 138/94.3 |

(Continued)

FOREIGN PATENT DOCUMENTS

| | | |
|---|---|---|
| JP | 48-63832 | 8/1973 |
| JP | 03-239884 | 10/1991 |

(Continued)

OTHER PUBLICATIONS

International Preliminary Report on Patentability for International Application No. PCT/JP2008/069292, mail date Jul. 5, 2009.

(Continued)

*Primary Examiner* — John K Fristoe, Jr.
*Assistant Examiner* — Marina Tietjen
(74) *Attorney, Agent, or Firm* — Brundidge & Stanger, P.C.

(57) ABSTRACT

To reduce invasion and adhesion of foreign matters into and onto the gating-member retreat room in the transition from the gate-open state to the gate-close state including retreat and on-shutting-movement of the gating-member. The shutter, being moved in the shuttering movement room, shuts the entrance aperture by making the shutter sealing contact with the stationary seal by such movement of the shutter itself when the gating-member is accommodated in the gating-member retreat room, and, also being moved in the shuttering movement room, shuts the entrance aperture by making the shutter sealing contact with the second gate seal by such movement of the shutter itself when the gating-member, being moved in the shuttering movement room, shuts the exhaust port by making the first gate seal contact with the stationary seal by such movement of the gating-member itself.

7 Claims, 9 Drawing Sheets

U.S. PATENT DOCUMENTS

| | | | | |
|---|---|---|---|---|
| 2,109,042 | A * | 2/1938 | Bennett et al. | 251/142 |
| 2,203,989 | A * | 6/1940 | Hamer | 251/159 |
| 3,109,457 | A * | 11/1963 | Oliveau | 137/625.18 |
| 3,145,969 | A * | 8/1964 | Von Zweck | 251/172 |
| 3,557,822 | A * | 1/1971 | Chronister | 137/315.32 |
| 3,665,953 | A * | 5/1972 | Chronister | 137/246.22 |
| 3,799,188 | A * | 3/1974 | Chronister | 137/271 |
| 3,904,171 | A * | 9/1975 | Chronister et al. | 251/159 |
| 4,018,420 | A * | 4/1977 | Muller et al. | 251/172 |
| 4,049,018 | A * | 9/1977 | Skibowski | 137/561 R |
| 4,163,458 | A * | 8/1979 | Bachmann | 137/240 |
| 4,214,608 | A * | 7/1980 | Mailliet et al. | 137/546 |
| 4,509,717 | A * | 4/1985 | Wright et al. | 251/144 |
| 4,679,768 | A * | 7/1987 | Hardy | 251/159 |
| 6,448,567 | B1 * | 9/2002 | Botelho et al. | 250/492.21 |
| 8,028,972 | B2 * | 10/2011 | Iijima | 251/302 |
| 2004/0079915 | A1 * | 4/2004 | Contin et al. | 251/167 |

FOREIGN PATENT DOCUMENTS

| | | |
|---|---|---|
| JP | 4-106583 | 9/1992 |
| JP | 07-042872 | 2/1995 |
| JP | 2004-108471 | 4/2004 |
| JP | 2005-009678 | 1/2005 |
| WO | 2006/132455 | 12/2006 |
| WO | 2007/066537 | 6/2007 |

OTHER PUBLICATIONS

Written Opinion of the International Searching Authority for International Application No. PCT/JP2008/069292, mail date Jun. 17, 2010.

* cited by examiner

Valve-close

FIG. 8
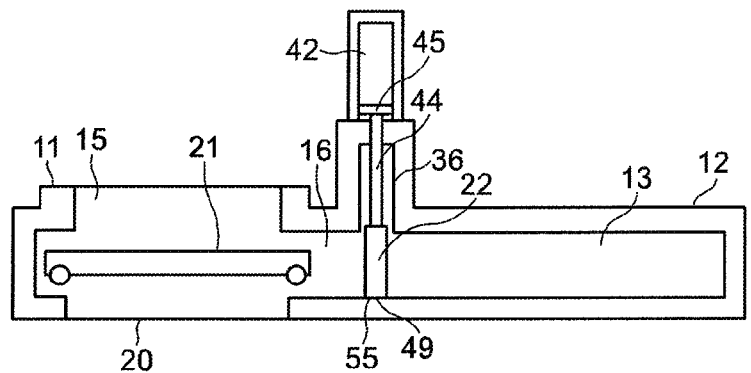
(1)
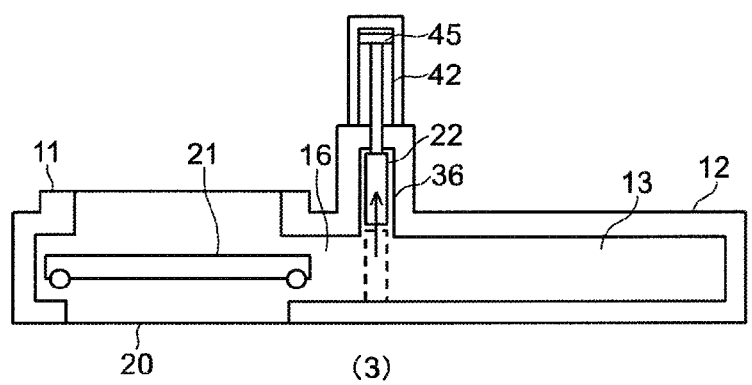
(2)
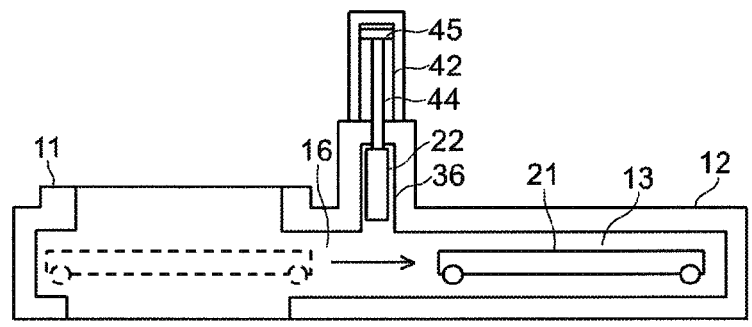
(3)
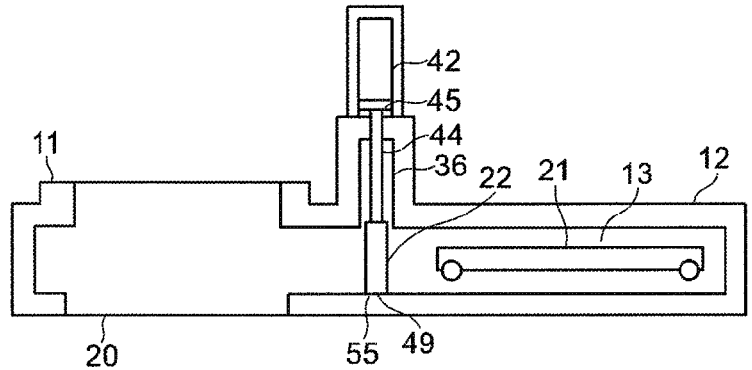
(4)

FIG. 9
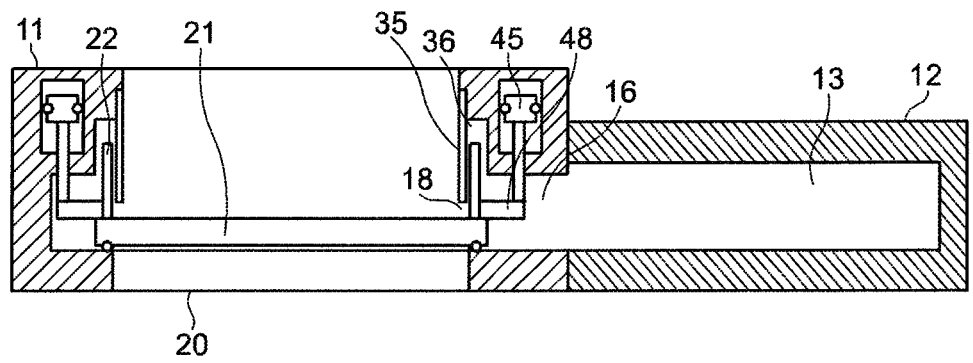
(1)
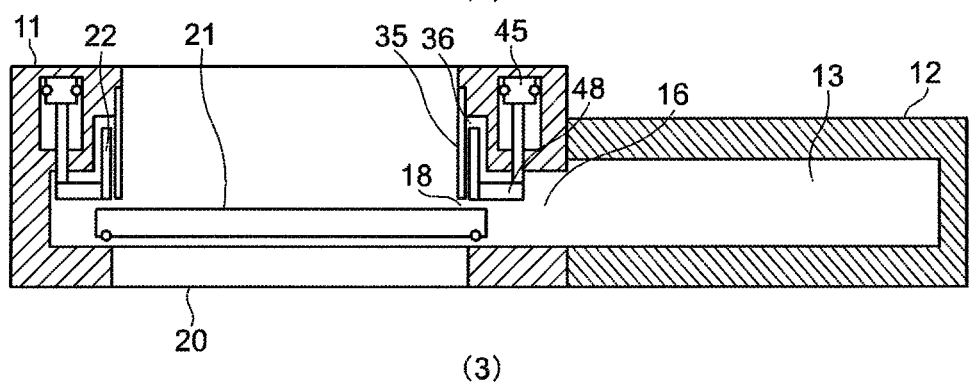
(2)
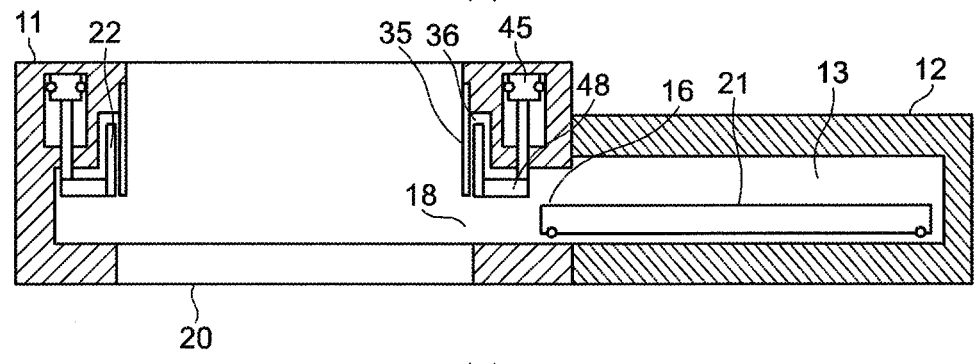
(3)
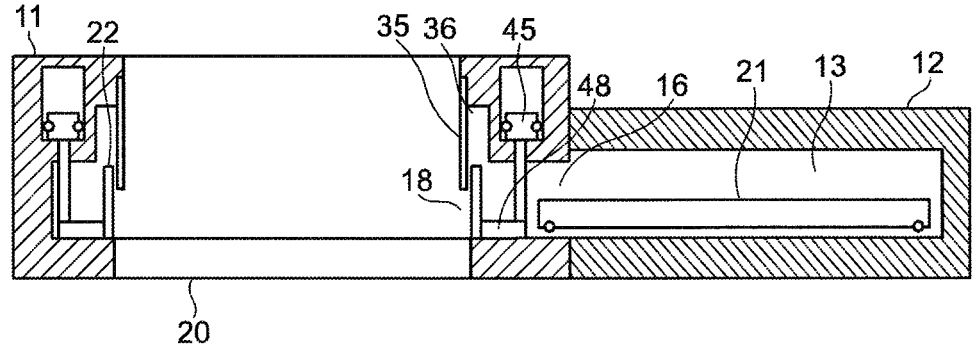
(4)

VACUUM GATE VALVE AND A METHOD OF OPENING AND CLOSING GATE USING THE SAME

TECHNICAL FIELD

The present invention relates to a vacuum gate valve to be used between vacuum processing apparatuses or between a vacuum processing apparatus and a vacuum pump and further relates to a method of the opening and closing of a gate that uses the vacuum gate valve.

BACKGROUND TECHNOLOGY

In the case a gating-member (valve disc) that shuts an exhaust port by close contact with a gate seal face provided on the exhaust port is provided, a means for closing a gating-member retreat aperture is equipped so that no invasion or no adhesion of foreign matters will occur in the gating-member retreat room when a gating-member is retreated from the exhaust port.

Japanese Patent Application Laid Open No. 7-42872 has described a technique for closing a gating-member retreat aperture, wherein a cylindrical shutter is provided in the exhaust passage that forms an exhaust port and the cylindrical shutter is moved in the exhaust passage to shut a gating-member retreat aperture on retreat of the gating-member.

Japanese Patent Application Laid Open No. 3-239884 has described an ultra-high vacuum gate valve. The ultra-high vacuum gate valve is comprised of a valve box, a valve seat, a valve plate having an opening, a valve bar connected to the valve plate, a valve bar driving mechanism, a valve plate presser, and a stretchable bellows interposed and connected between the valve box, the valve seat, and the valve presser, wherein the valve plate is always in contact with the valve seat and the valve plate presser so that the dead space in the valve box is clogged or shut when the valve plate is in the open and the close positions.

DISCLOSURE OF THE INVENTION

The cylindrical shutter described in Japanese Patent Application Laid Open No. 7-42872 is designed to move in an exhaust passage. The stretchable bellows described in Japanese Patent Application Laid Open No. 3-239884 is provided in a dead space. In configurations like these examples of conventional arts, the shutter or the bellows comes to contact with the exhaust when the gating-member retreats or moves for clogging or shutting inviting a possible adhesion of foreign matters thereon.

In view of these possible problems of adhesion of foreign matters, the present invention intends to provide a vacuum gate valve and a method of the opening and closing of a gate using the vacuum gate valve. The invented vacuum gate valve is capable of reducing the invasion and adhesion of foreign matters into or onto the gating-member retreat room over the operational states of the gating-member covering from the open-state to the shut-state and from the shut-state to the open-state including on-moving states for retreating and shutting; the invented method is a method of the opening and closing of a gate using the invented vacuum gate valve.

The present invention provides a vacuum gate valve, comprising a main body that has an exhaust passage barrel provided with an exhaust port at the end thereof, a gating-member retreat accommodation that has a gating-member retreat room, a gating-member that moves from the gating-member retreat room to the exhaust passage barrel so as to shut the exhaust port and so as to be accommodated in the gating-member retreat room, a gating-member driver for moving the gating-member, a shutter provided movably along the exhaust passage barrel in a shuttering movement room, and a shutter driver that moves the shutter, wherein the main body has a entrance aperture thereon formed facing the lateral side of the exhaust passage barrel and has a shuttering section comprised of the shuttering movement room formed therein for separating the shutter from the exhaust passage barrel at the times when the gating-member moves to shut the entrance aperture and when the gating-member moves into the gating-member retreat room for retreat;

the gating-member retreat accommodation is provided so that the gating-member retreat room will have communicative connection with the shuttering movement room;

the shuttering section has a stationary seal on the place thereof confronting the entrance aperture of the shuttering movement room;

the shutter has a shutter sealing that confronts the stationary seal;

the gating-member is structured movable from the gating-member retreat room to the shuttering movement room and further from the shuttering movement room to the exhaust passage barrel;

a first gate seal is formed on one side of the gating-member confronting the stationary seal;

a second gate seal is formed on the opposite side of the gating-member with respect to the first gate seal confronting the shutter sealing; and the shutter, being moved in the shuttering movement room, shuts the entrance aperture by making the shutter sealing contact with the stationary seal by such movement of the shutter itself when the gating-member is accommodated in the gating-member retreat room, and, also being moved in the shuttering movement room, shuts the entrance aperture by making the shutter sealing contact with the second gate seal by such movement of the shutter itself when the gating-member, being moved in the shuttering movement room, shuts the exhaust port by making the first gate seal contact with the stationary seal by such movement of the gating-member itself.

The present invention further provides the vacuum gate valve as defined above, wherein the stationary seal, the shutter sealing, the first gate seal, and the second gate seal are arranged lengthwise along the exhaust passage barrel and on the same plane in the shuttering movement room.

The present invention still provides the vacuum gate valve as defined above, wherein the shutter sealing is formed on a shutter-ring; the shutter-ring and the shutter are mutually detachable; the exhaust passage barrel has a cylindrical cover on the inner periphery thereof and has a shutter accommodation, which forms a part of the shuttering movement room, on the outside periphery of the cylindrical cover; a shutter-driving piston of the shutter driver is provided on the lateral side of the shutter accommodation along the shutter accommodation; and said shutter-driving piston is connected to the shutter-ring, thereby the shutter-ring is moved along the exhaust passage barrel by the shutter-driving piston that operates along the exhaust passage barrel.

The present invention still further provides the vacuum gate valve as defined above, wherein the gating-member driver and the shutter driver are driven by one pair of a driving source and a driving power switching device; and a control device is provided so that the shutter will be controlled to be moved when the gating-member retreats into the gating-member retreat room.

The present invention more provides the vacuum gate valve as defined above, wherein the gating-member retreat accommodation is formed in a case-like-shape and integrated into one body with the main body on the lateral side of the main body in a detachable manner; the gating-member is a pendulum style gating-member; and the gating-member swings in the gating-member retreat accommodation and the shuttering movement room.

The present invention provides a method of the opening and closing of a vacuum gate valve, which is comprised of a main body that has an exhaust passage barrel provided with an exhaust port at the end thereof, a gating-member retreat accommodation that has a gating-member retreat room, a gating-member that moves from the gating-member retreat room to the exhaust passage barrel so as to shut the exhaust port and so as to be accommodated in the gating-member retreat room, a gating-member driver for moving the gating-member, a shutter provided movably along the exhaust passage barrel in a shuttering movement room, a shutter driver that moves the shutter, wherein the main body has an entrance aperture thereon formed facing the lateral side of the exhaust passage barrel and has a shuttering section comprised of the shuttering movement room formed therein for separating the shutter from the exhaust passage barrel at the times when the gating-member shuts the entrance aperture and when the gating-member retreats into the gating-member retreat room;

the gating-member retreat accommodation is provided so that the gating-member retreat room will have communicative connection with the shuttering movement room;

the shuttering section has a stationary seal on the place thereof confronting the entrance aperture of the shuttering movement room;

the shutter has a shutter sealing that confronts the stationary seal;

a first gate seal is formed on one side of the gating-member confronting the stationary seal; and a second gate seal is formed on the opposite side of the gating-member with respect to the first gate seal confronting the shutter sealing, wherein the method comprises:

moving the shutter in the shuttering movement room for establishing the contact of the shutter sealing with the stationary seal to shut the entrance aperture by such movement of the shutter itself when the gating-member is accommodated in the gating-member retreat room; and moving the shutter in the shuttering movement room for establishing the contact of the shutter sealing with the second gate seal to shut the entrance aperture by such movement of the shutter itself when the gating-member is moved from the gating-member retreat room to the shuttering movement room and from the shuttering movement room to the exhaust passage barrel for shutting the exhaust port by the contact of the first gate seal with the stationary seal.

The present invention further provides the method of the opening and closing of a gate of the vacuum gate valve as defined above, wherein the stationary seal, the shutter sealing, the first gate seal, and the second gate seal move lengthwise along the exhaust passage barrel and on the same plane with respect to the stationary seal in the shuttering movement room.

An embodiment of the present invention will be explained referring to drawings as follows.

According to the present invention, the reducing of the invasion and adhesion of foreign matters into or onto the gating-member retreat room is attainable over each operational state of the gating-member covering from the open-state to the shut-state and from the shut-state to the open-state. This feature is rendered by such a configuration: that a shutter and a shuttering movement room are provided, that the shutter shuts the entrance aperture of the shuttering movement room regardless of the gating-member being in the retreat state or in the exhaust port-shut-state, and that the shutter is separated from the exhaust passage barrel while the gating-member is on-move for retreat and for shutting.

BRIEF DESCRIPTION OF DRAWINGS

FIG. 8 is an explanatory illustration to describe movements of the gating-member and the shutter.

FIG. 9 is an illustration to indicate operational states from the valve-close to the valve-open.

THE BEST MODE FOR IMPLEMENTING THE INVENTION

Embodiments

Figure 1:
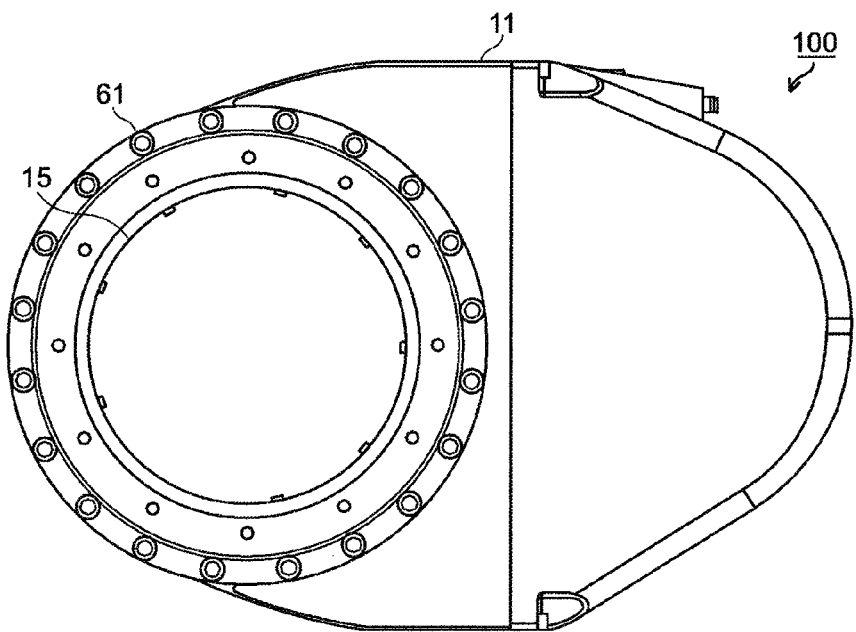
FIG. 1 is a top view of an embodiment of the present invention.
Figure 2:
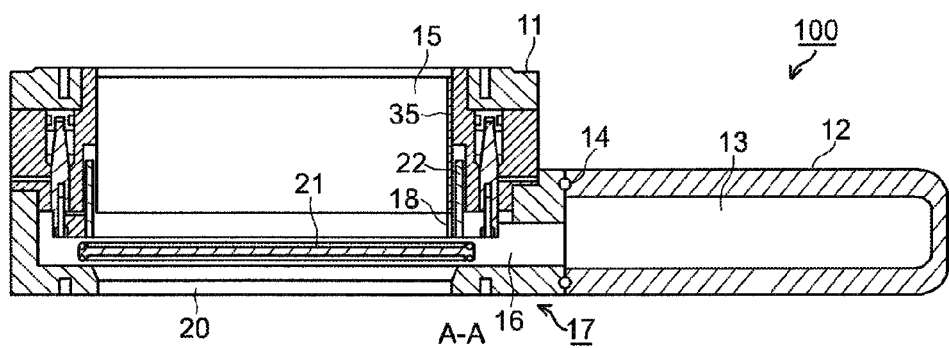
FIG. 2 is a sectional side view of the embodiment of the present invention (a view sectioned along the line A-A in FIG. 3).
Figure 3:
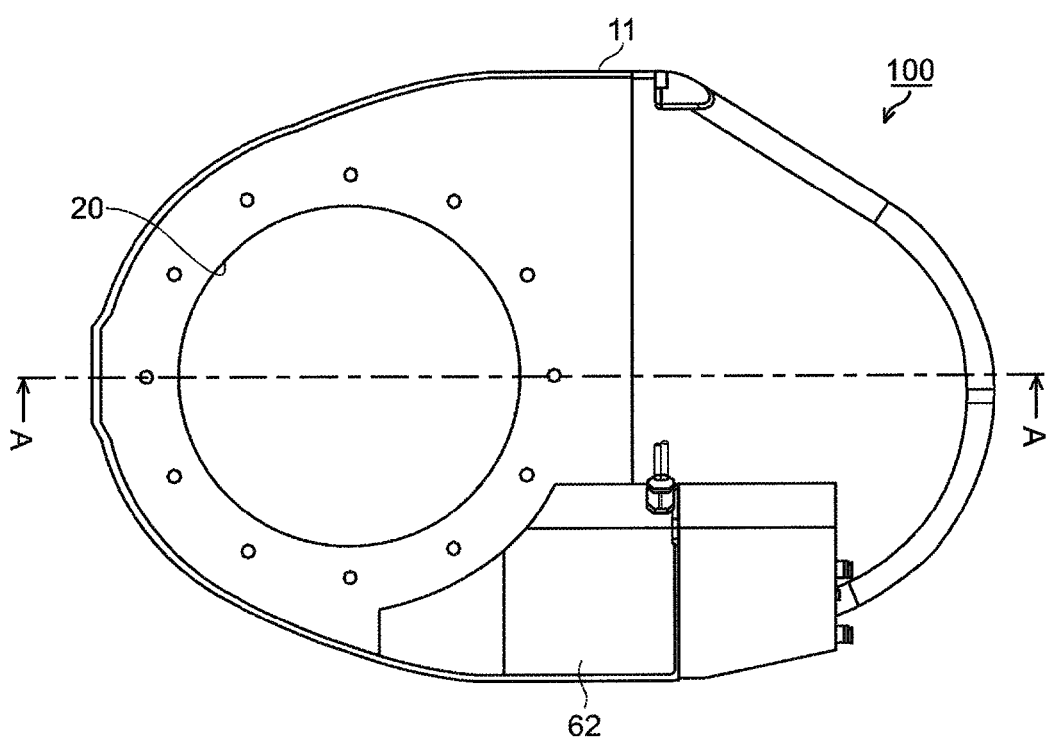
FIG. 3 is a bottom view of the embodiment of the present invention.

FIG. 1 is a top view of the vacuum gate valve of an embodiment of the present invention; FIG. 2 is a sectional side view thereof; and FIG. 3 is a bottom view thereof. FIG. 2 is a sectional view of FIG. 3 sectioned along the line A-A.

As shown in these figures, a vacuum gate valve 100 is comprised of a main body 11 and a gating-member retreat accommodation 12, wherein both the main body 11 and the gating-member retreat accommodation 12 are formed in a case-like-shape and are integrated into one body in a mutually detachable manner with an O-ring 14 arranged between them. The main body 11 is formed taller than the gating-member retreat accommodation 12 in height and they are almost elliptical having a fat middle portion in shape as shown in FIG. 1 when viewed from the top.

At the center of the inside of the main body 11, an exhaust passage barrel 15 is provided. Facing the lateral side of the exhaust passage barrel 15, a shutter movement room 16 is provided in an independent manner around the exhaust passage barrel 15. That is, a shuttering section 17 that forms the shuttering movement room 16 is provided around the main body 11 on the lateral side thereof.

The gating-member retreat accommodation 12 has a gating-member retreat room 13 inside thereof. The gating-member retreat room 13 has a communicative connection with the exhaust passage barrel 15 through the shuttering movement room 16. The exhaust passage barrel 15 is made cylindrical in shape. Consequently, the shuttering movement room 16 is also provided around the exhaust passage barrel 15 in an independent shape and an entrance aperture 18 is provided around the shuttering movement room 16 facing the lateral side of the exhaust passage barrel 15. At the end of the exhaust passage barrel 15 (the bottom end or the outlet end), an exhaust port 20 is provided.

A gating-member (valve disc) 21 is given such a size as is capable of shutting the exhaust port 20 and is arranged movable inside the exhaust passage barrel 15, the shuttering movement room 16, and the gating-member retreat room 13, as will be described later.

In the shuttering movement room 16, a shutter 22 of cylindrical shape is provided lengthwise the barrel of the exhaust passage barrel 15 and movable along the exhaust passage barrel 15.

Figure 4:
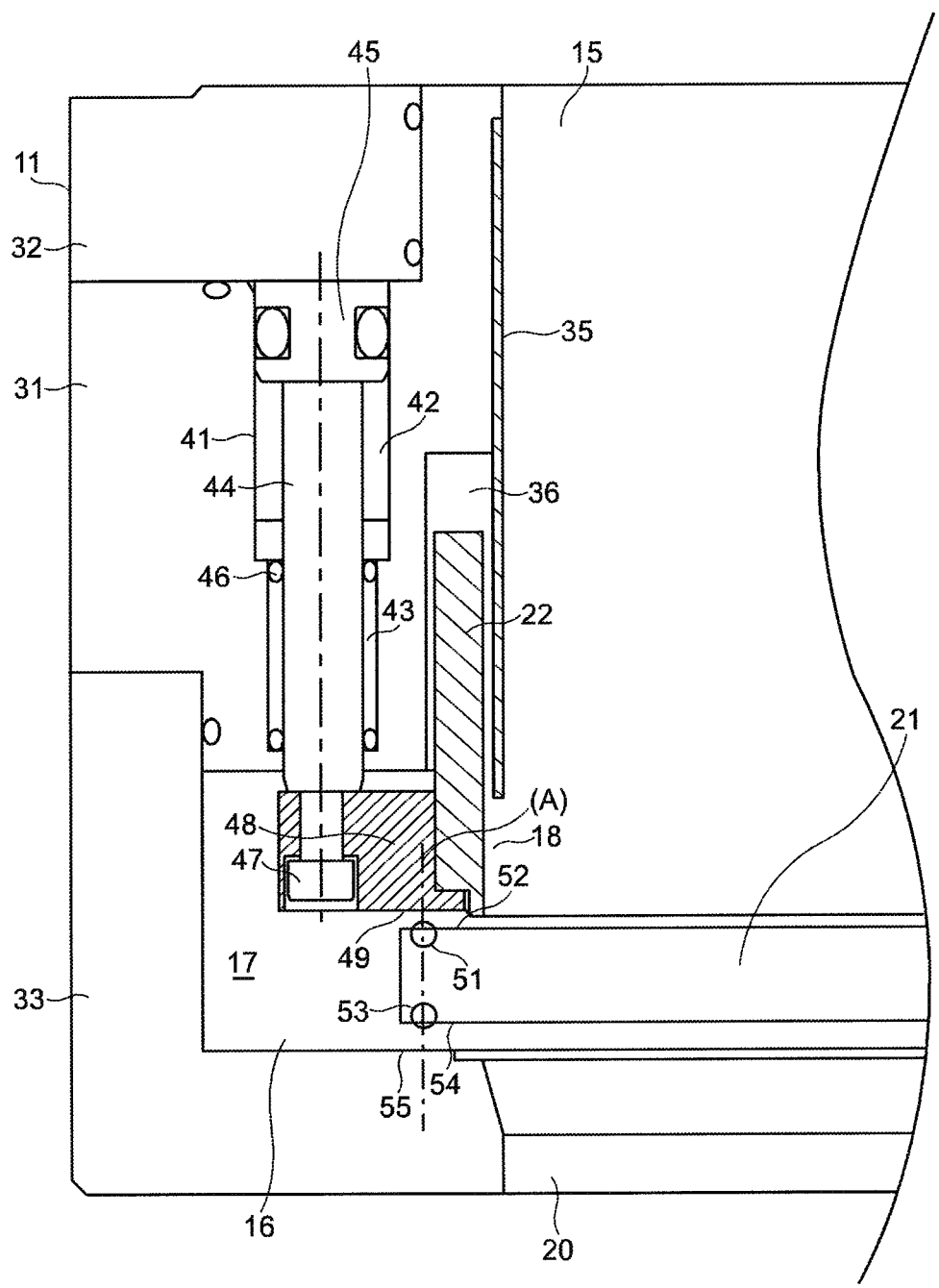
FIG. 4 is a detailed view of a part of FIG. 2.

FIG. 4 shows the shuttering movement room 16 and details of structural arrangement of the vicinity of the shuttering movement room 16 shown in FIG. 1.

As shown in FIG. 4, the main body 11 is comprised of a center member 31, an upper member 32, and a lower member 33. These members are integrated, with sealing material interposed between each of the contacting faces on these members, into one body forming a cylindrical case in overall view.

The center member 31 and the lower member 33 create the shuttering movement room 16 in an area underneath the bottom of the center member 31 but inside the lower member 33. This means that the center member 31 and the lower member 33 form the shuttering section 17 that has the shuttering movement room 16.

The shuttering movement room 16 is formed into such a room as gradually enlarges in plane-wise toward the gating-member retreat room 13 so that the shape of the room will permit the pendulum motion of the gating-member 21 as will be described later.

On the wall of the exhaust passage barrel 15 of the main body 11, a cover 35 of cylindrical shape is fixed in embedding manner extending toward the exhaust port 20 provided lower part of the main body 11.

On the inner wall of the center member 31, a recess is formed. The front side of the recess is covered with the cover 35 of cylindrical shape to form a shutter accommodation 36. The bottom part of the shutter accommodation 36 communicates with the shuttering movement room 16 to become a part of the shuttering movement room 16. Consequently, the shuttering movement room 16 is given such a shape that the shutter accommodation 36 protrudes upward.

The shutter accommodation 36 accommodates the shutter 22. A shown in the figure, the vertical length of the shutter accommodation 36 and the covering length of the cover 35 over the recess are made equal. The shutter 22 is arranged movable in the shutter accommodation 36 and is arranged in the shuttering movement room 16 located below the shutter accommodation 36 movable toward the gating-member 21. When the shutter 22 is moved upward, almost all the body of the shutter 22 is accommodated in the shutter accommodation 36.

A shutter driver 41 is provided in such a place along the shutter accommodation 36 as is inside the center member 31 and on the lateral side of the shutter accommodation 36. The shutter driver 41 is comprised of a cylinder 42, an O-ring accommodation 43, a shutter-driving piston 45 provided on the top end of a driving shaft 44 arranged passing through the cylinder 42 and the O-ring accommodation 43, an O-ring 46 arranged in the O-ring accommodation 43, and a shatter-ring holder 47 provided on the bottom end of the driving shaft 44.

Into the cylinder 42, which is formed between the top end face of the shutter-driving piston 45 and the bottom end face of the upper member 32, operating air is introduced from a driving source to cause air pressure. The air pressure operates the shutter-driving piston 45 to move the driving shaft 44 and the shutter-ring holder 47 downward against pressing force of the O-ring 46.

On the pressing side of the bottom end of the shutter 22, a shutter-ring (seal-ring) 48 is fixed. The shutter-ring 48 is held by the shutter-ring holder 47 provided at the left end thereof and moved thereby. As the shutter-ring 48 moves, the shutter 22 moves integrally therewith in a vertical direction.

On the bottom face of the shutter-ring 48, a portion that serves as a sealing face is provided, which is named a shutter sealing 49.

On the top face of the gating-member 21, an O-ring 51 is provided confronting the shutter sealing 49. This portion, including the O-ring 51, is named a second gate seal 52.

On the other face of the gating-member 21, which is the bottom face thereof, another O-ring 53 is provided. This portion, including the O-ring 53, is named a first gate seal 54.

The entrance area around the exhaust port 20 provided on the lower member 33 is formed as a valve seat, on which the gating-member 21 seats. On the valve seat, a stationary sealing area is provided; the area is named a stationary seal 55. As described above, the shuttering section 17 has the stationary seal 55 confronting the entrance aperture 18 of the shuttering movement room 16.

Being interposed respectively between the shutter sealing 49 and the second gate seal 52 and between the first gate seal 54 and the stationary seal 55, the O-ring 51 and the O-ring 53 work as functional elements that provide sealing function, and cushioning and damping function. However, the O-ring 51 is not an essential element in forming a sealing portion.

In this configuration, the stationary seal 55, the shutter sealing 49, the first gate seal 54, and the second gate seal 52 are arranged lengthwise along the exhaust passage barrel 15 and on the same plane (A) in the shuttering movement room 16. The shutter sealing 49 is formed on the shutter-ring 48 as stated above. The shutter-ring 48 and the shutter 22, and the shutter-ring 48 and the shutter-ring holder 47 as well, are arranged mutually detachable. The main body 11 has the shuttering movement room 16 on the lateral side of the exhaust passage barrel 15, which are communicatively connected each other so that the gating-member 21 can move between them, wherein the entrance aperture 18 of the shuttering movement room 16 serves as an entrance to the communicative connection. This means that the shuttering section 17 formed in the main body 11 has the entrance aperture 18 facing the lateral side of the exhaust passage barrel 15 and has the shuttering movement room 16 that can separate the shutter 22 from the exhaust passage barrel 15 by means of accommodating the same therein. This separation of the shutter 22 from the exhaust passage barrel 15, the establishing of seal at each of the sealing portions, and shutting the entrance aperture 18 by the shutter 22 are performed within the shuttering movement room 16. In the shuttering section 17, the stationary seal 55 is formed on the valve seat confronting the entrance aperture 18 of the shuttering movement room 16. As stated above, the shutter 22 has the shutter sealing 49 on the bottom end confronting the stationary seal 55.

As FIG. 1 shows, the main body 11 has a bolt 61 surrounding the exhaust passage barrel 15 to permit fixing the main body 11 on other members. As shown in FIG. 3, the main body 11 has a gating and shuttering manipulator 62 for operating the gating-member 21.

Figure 5:
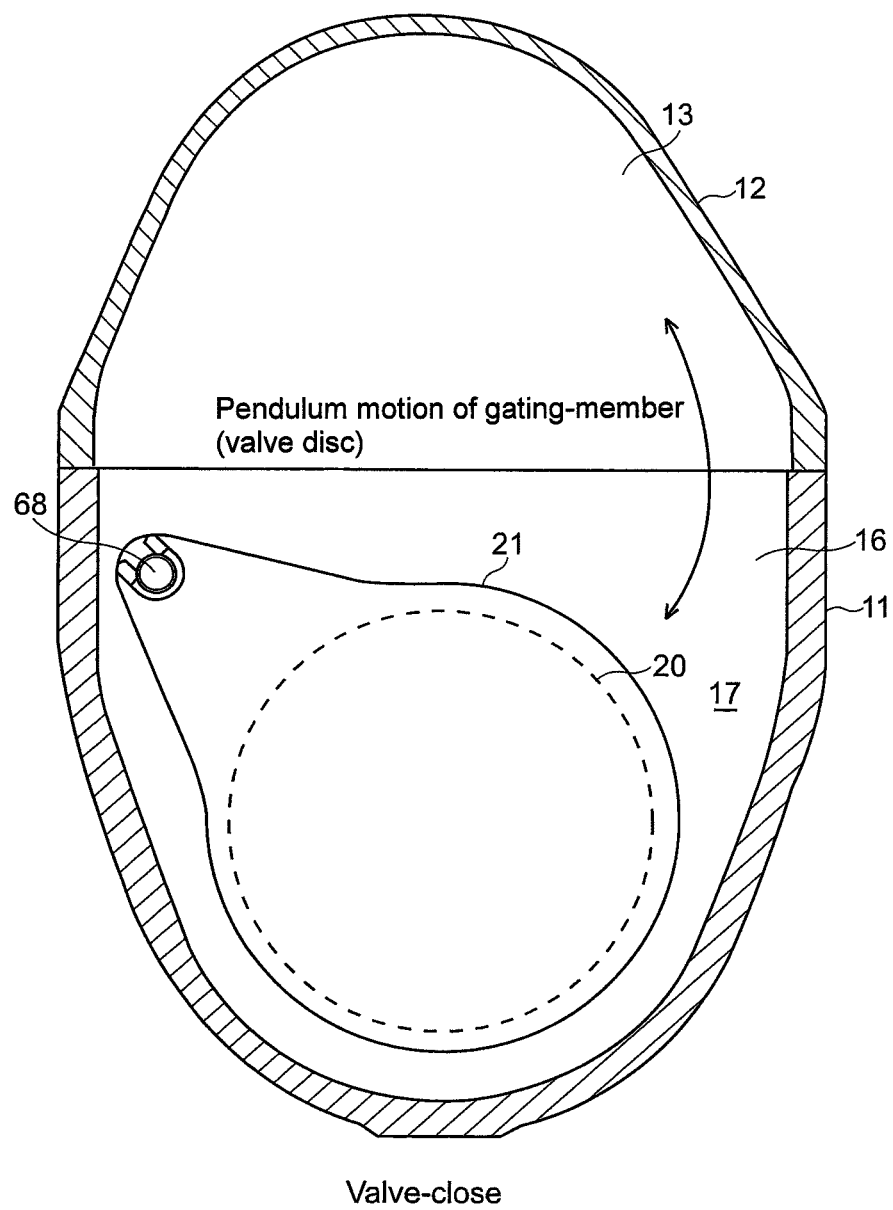
FIG. 5 is an illustration to show the pendulum motion aspect (1) of the gating-member.
Figure 6:
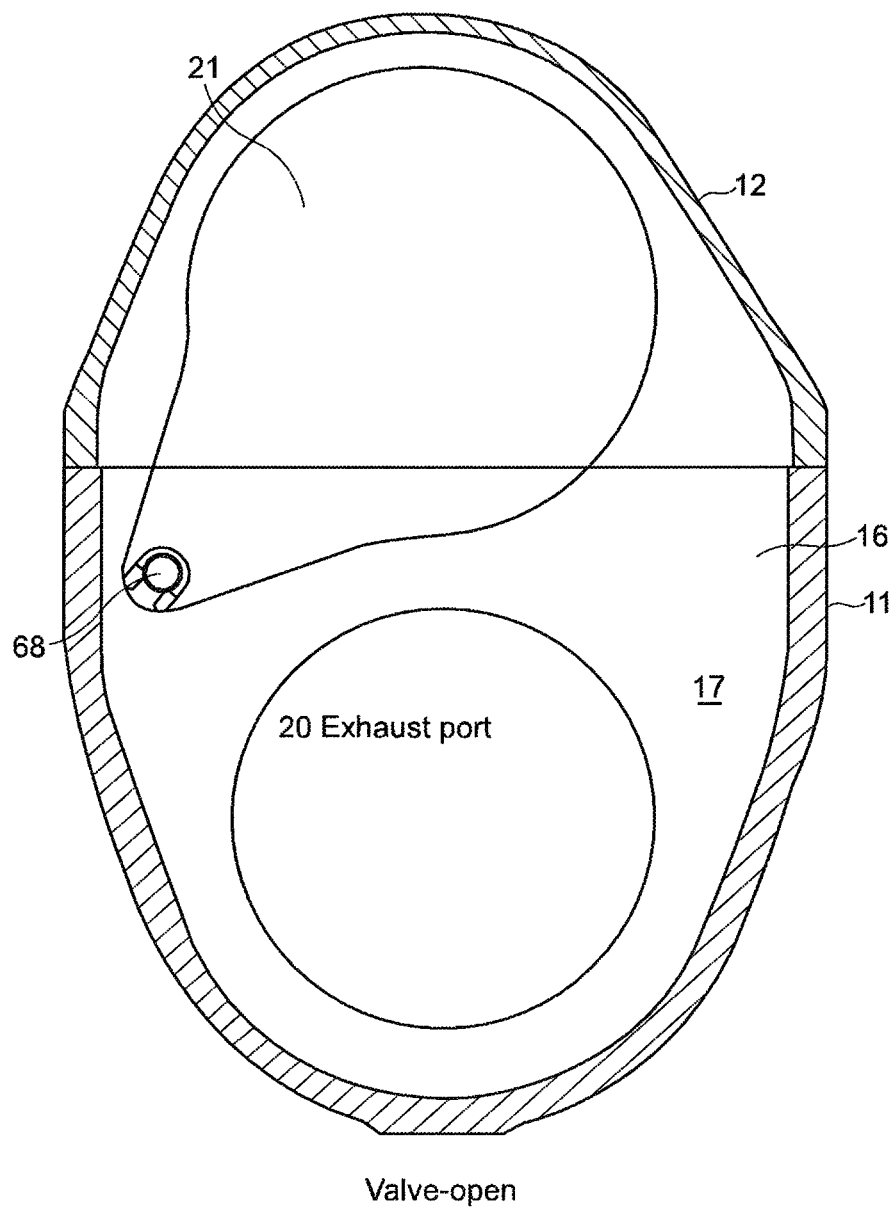
FIG. 6 is an illustration to show the pendulum motion aspect (2) of the gating-member.

FIG. 5 and FIG. 6 show the open-state and shut-state of the gating-member of the vacuum valve 100. FIG. 5 shows the valve-close state caused by the gating-member 21 and FIG. 6 shows the valve-open state caused by the gating-member 21. As shown in these figures, the shuttering movement room 16 communicatively connects with the gating-member retreat room 13 and the gating-member 12 makes a pendulum motion, i.e., valve disc rotation, between the shuttering movement room 16 and the gating-member retreat room 13 centered at a shaft 68. FIG. 5 shows a state such that the exhaust port 20 is shut caused by the pendulum motion of the gating-member 21 into the shuttering movement room 16; and FIG. 6 shows a state such that the exhaust port 20 is opened caused by the pendulum motion of the gating-member 21 into the gating-member retreat room 13, wherein the gating-member 21 itself retreats in the gating-member retreat room 13.

Figure 7:
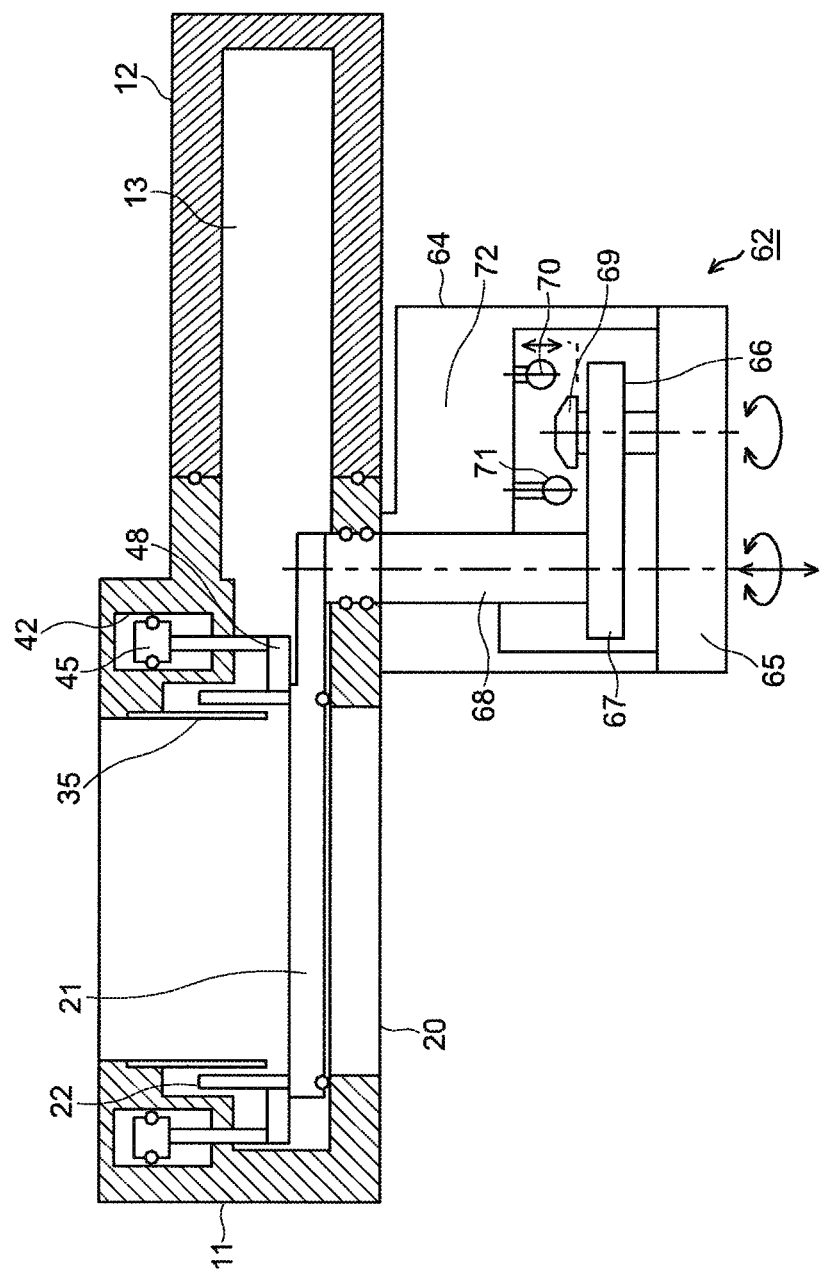
FIG. 7 is a configuration view of a gating and shuttering manipulator.

FIG. 7 shows the configuration of the gating and shuttering manipulator 62 that serves as a driver for the gating and shuttering.

As shown in FIG. 7, the gating and shuttering manipulator 62 is comprised of a manipulator body 64, an actuator 65 arranged inside the manipulator body 64, a gear group of gears 66 and 67 that are driven in rotatory manner by the actuator 65, a shaft 68 that is manipulated in rotatory manner by the gear 67 that rotates around a non-oscillating axis, an air switching lever 69 that is manipulated in oscillating manner by the gear 66 that revolves with oscillation, air switching valves 70 and 71 that are manipulated by the air switching lever 69 that oscillates, and an air chamber 72 that feeds operating air to the air switching valves 71 and 71.

By the operating air thus fed, the actuator 65 is manipulated to rotate the gear group of gears 66 and 67. With this manipulation, the shaft 68 rotates causing the gating-member 21 fixed on the shaft 68 to make pendulum motion to reach such a state as is shown in FIGS. 5 and 6. Following this behavior, the gear 66 in oscillation switches the operating air to the air switching valves 70 and 71. A driving force switching device is thus configured. For the feeding of the operating air, a control apparatus that performs a sequential control (a computerized control running on a program) may be applicable instead of above-stated mechanical control.

The switched operating air is introduced from the air chamber 72 into the top of or the bottom of the cylinder 42 to act on the shutter-driving piston 45 causing the shutter 22 to move vertically in an interlocked manner with the movement of the pendulum motion of the gating-member 21. Thus, a gating-member driver and a part of the shutter driver 41 are configured in the above-stated manner; in the present example, one pair of air driving units is used. The gating-member driver and the shutter driver 41 may be driven severally by separate driving sources.

FIGS. 5 to 7 show the gating-member 21 of a pendulum style (Penduroll type gating device). Instead, the shutter 22 may be moved vertically in a manner interlocked with a linear motion of a gating device using such a gating element as can move linearly.

FIG. 8 shows the interlocking state of movement of the gating-member 21 with the shutter 22.

FIG. 8(1) shows such a state that the gating-member 21 is in a position confronting the exhaust port 20, that the shutter 22 has moved downward to the bottom end, and that the shutter sealing 49 is in contact with the stationary seal 55.

FIG. 8(2) shows such a state that the shutter-driving piston 45 has moved upward to the top end by the introduction of switching operating air into the cylinder 42 and that the shutter 22 has been accommodated in the shutter accommodation 36 enabling the gating-member 21 to retreat.

FIG. 8(3) shows such a state that rotation of the shaft 68 has made the gating-member 21 retreat from the exhaust passage barrel 15 into the gating-member retreat room 13 passing through the shuttering movement room 16.

FIG. 8(4) shows such a state that the switched operating air has been introduced into the cylinder 42 on the retreat of the gating-member 21 into the gating-member retreat room 13 causing the shutter 22 to move downward to reach its bottom of travel, and that the shutter sealing 49 is in contact with the stationary seal 55.

As stated above, the gating-member 21 and the shutter 22 travel so as to cross each other. It however should be noted that these figures are schematic illustrations to explanatorily describe movements of the gating-member 21 and the shutter 22 with the seal-ring 48 omitted from the figure for simplicity; therefore they do not show the exact details of sealing.

FIG. 9 shows the sequence from the valve-close state (CLOSE) to the valve-open state (OPEN).

FIG. 9(1) shows the valve-close state. In this state, the exhaust port 20 is shut by the gating-member 21 with the first gate seal 54 on the gating-member 21 contacted with the stationary seal 55, and the entrance aperture 18 of the shuttering movement room 16 is shut by the shutter 22 together with the gating-member 21 with the shutter sealing 49 contacted with the second gate seal 52. Thereby, foreign matters (deposits) blown out from a processing chamber is prevented from entering the gating-member retreat room 13 through the entrance aperture 18.

FIG. 9(2) shows such a state that the shutter 22 is in the upward-moved position to permit the gating-member 21 to retreat into the gating-member retreat room 13. In this state, operating air has been switched and the shutter 22 is accommodated in the shutter accommodation 36; and the exhaust passage barrel 15, the shuttering movement room 16, and the gating-member retreat room 13 are communicatively connected.

FIG. 9(3) shows such a state that the gating-member 21 is in retreat in the gating-member retreat room 13.

FIG. 9(4) shows such a state that operating air is switched with the gating-member 21 retreated in the gating-member retreat room 13 and that the shutter 22 accommodated in the shutter accommodation 36 has moved downwardly to reach its bottom of travel causing the shutter sealing 49 to contact with the stationary seal 55; thereby the entrance aperture 18 is shut by the shutter 22 alone. This state is the valve-open state.

Figure 10:
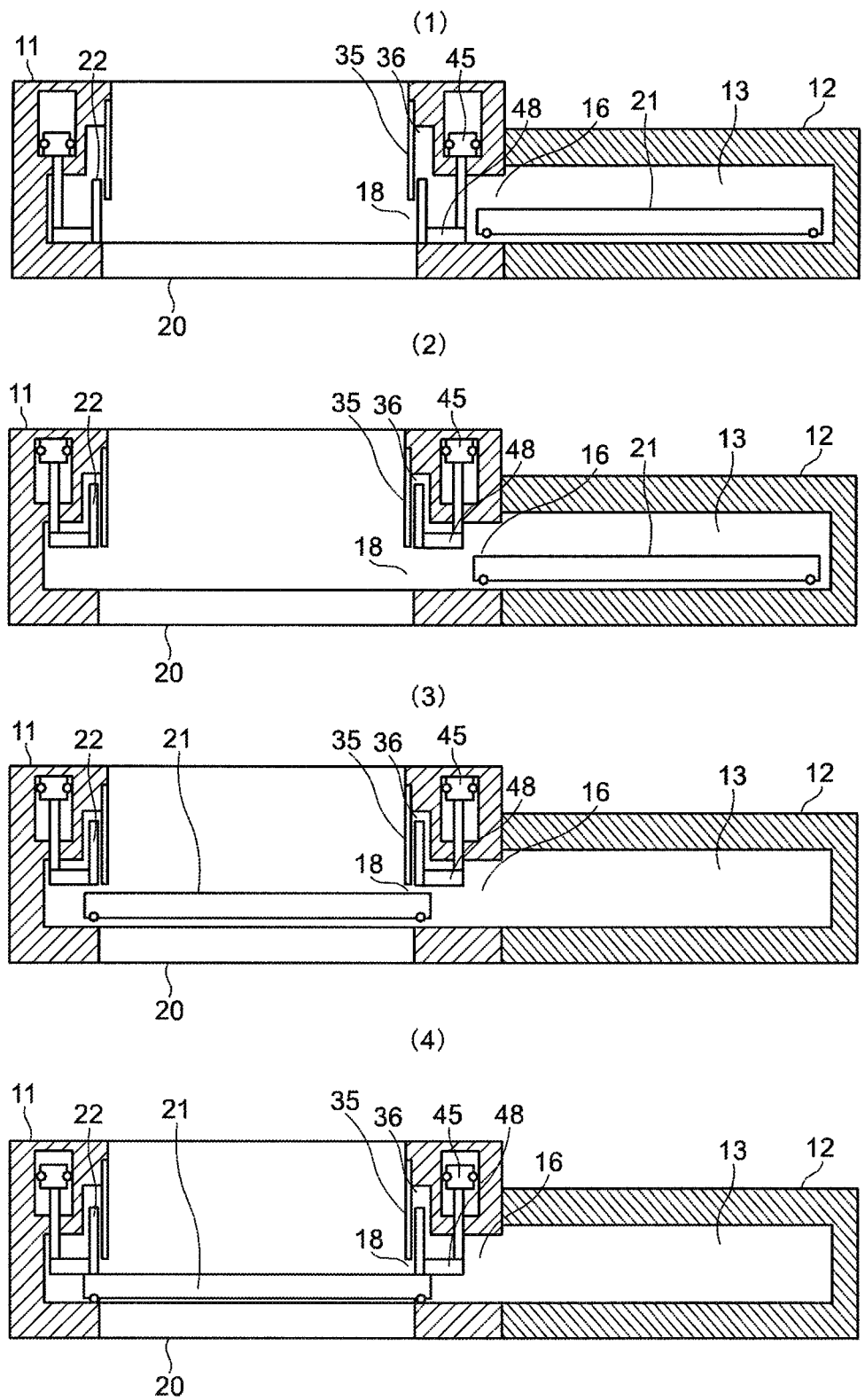
FIG. 10 is an illustration to indicate operational states from the valve-open to the valve-close.

FIG. 10 shows the sequence from the valve-open state to the valve-close state. Operational steps are reverse to the sequence shown in FIG. 9.

FIG. 10(1), which corresponds to FIG. 9(4), shows such a state that the gating-member 21 has retreated in the gating-member retreat room 13 and the shutter 22 alone shuts the entrance aperture 18. Under this state, the shutter sealing 49 is in contact with the stationary seal 55.

FIG. 10(2), which corresponds to FIG. 9(3), shows such a state that the shutter 22 has moved upwardly to be accommodated in the shutter accommodation 36 to permit the gating-member 21 to move. Thereby, the gating-member retreat room 13, the shuttering movement room 16, and the exhaust passage barrel 15 are communicatively connected.

FIG. 10(3), which corresponds to FIG. 9(2), shows such a state that the gating-member 21 has moved in communicatively connected the gating-member retreat room 13, the shuttering movement room 16, and the exhaust passage barrel 15 and has moved over the exhaust port 20.

FIG. 10(4) corresponds to FIG. 9(1). In this state, when the gating-member 21 sitting over the exhaust port 20 moves downwardly to cause the first gate seal 54 to contact with the stationary seal 55 and the gating-member 21 moves to the exhaust port 20, the operating air is switched so that the exhaust port 20 will be shut. At the same time, the shutter 22 moves downwardly to cause the shutter sealing 49 to contact with the second gate seal 52 with the shutter 22 shutting the entrance aperture 18 together with the gating-member 21. This state is the valve-close state.

The shutter 22, being moved in the shuttering movement room 16, shuts the entrance aperture 18 by making the shutter sealing 49 contact with the stationary seal 55 by such movement of the shutter 22 itself when the gating-member 21 is accommodated in the gating-member retreat room 13 and, also being moved in the shuttering movement room 16, shuts the entrance aperture 18 by making the shutter sealing 49 contact with the second gate seal 52 by such movement of the shutter 22 itself when the gating-member 21, being moved in the shuttering movement room 16, shuts the exhaust port 20 by making the first gate seal 54 contact with the stationary seal 55 by such movement of the gating-member 21 itself.

This means that the stationary seal 55, the shutter sealing 49, the first gate seal 54, and the second gate seal 52 move lengthwise along the exhaust passage barrel 15 and on the same plane (A) with respect to the stationary seal 55 in the shuttering movement room 16.

When the gating-member 21 is in the state of the exhaust port 20 being open, the shutter sealing 49 is in contact with the stationary seal 55 preventing the stationary seal 55 from being exposed to the exhaust port 20 enabling adhesion of foreign matters onto the stationary seal 55 to be hindered. When the gating-member 21 is in the state of the exhaust port 20 being closed, the first gate seal 52 is in contact with the stationary seal 55 and the shutter sealing 49 is in contact with the second gate seal 52, thereby the entrance aperture 18 is shut preventing invasion and adhesion of foreign matters into or onto the gating-member retreat room 13. The shutter 22 is accommodated in the shutter accommodation 36, which forms a part of the shuttering movement room 16, when the gating-member 21 is on-moving and when the gating-member 21 is on-shutting the exhaust port 20; and thereby adhesion of foreign matters on the shutter 22 is prevented. The shutter 22 moves in the shuttering movement room 16 vertically rendering such a function as prevents, in the shuttering movement room 16, invasion of foreign matters into the gating-member retreat room 13 as stated above. When the gating-member 21 shuts the exhaust port 20, each sealing portion being aligned vertically on the same perpendicular line in the shuttering movement room 16 assures the shutting and prevents effectively the adhesion of foreign matters.

What is claimed is:

1. A vacuum gate valve, comprising
a main body that has an exhaust passage barrel provided with an exhaust port at the end thereof,
a gating-member retreat accommodation that has a gating-member retreat room,
a gating-member that moves from said gating-member retreat room to said exhaust passage barrel so as to shut said exhaust port and so as to be accommodated in said gating-member retreat room,
a gating-member driver for moving said gating-member,
a shutter provided movably along said exhaust passage barrel in a shuttering movement room, and
a shutter driver that moves said shutter, wherein
said main body has an entrance aperture of said gating-member retreat room that communicates with said exhaust port thereon formed facing the lateral side of said exhaust passage barrel;
said shutter shuts said entrance aperture of said gating member retreat room at the time when said gating-member shuts said exhaust port and when said gating-member moves into said gating-member retreat room for retreat;
said shutter has a shutter-ring having a shutter sealing that is touchable with a stationary seal provided on a fitting seat formed on said exhaust port, and is accommodated in a shutter accommodation room located on the lateral side of said exhaust passage barrel, and is formed in a cylindrical shape that permits its lengthwise movement, and is installed so as to confront said stationary seal;
said gating-member is made movable in said shuttering movement room located between said gating-member retreat room and said exhaust passage barrel;
a first gate seal is formed on one side of said gating-member confronting said stationary seal; and
a second gate seal is formed on the opposite side of said first gate seal confronting said shutter sealing;
wherein said shutter is moved lengthwise said exhaust passage barrel;
said gating-member is accommodated in said gating-member retreat room;
said shutter sealing is made to contact with said stationary seal being caused by said shutter-ring being moved; and thereby said shutter establishes, on said exhaust passage barrel side of said shutter-ring, the shutting of said entrance aperture of said gating-member retreat room;
further wherein
said gating member is moved from said gating-member retreat room to said exhaust passage barrel;
said first gate seal is made to contact with said stationary seal to shut said exhaust port; said shutter-ring is moved;
said shutter sealing is made to contact with said second gate seal; and
thereby said shutter establishes shutting said entrance aperture of said gating-member retreat room;
said shutter accommodation room has a cylindrical cover on the inner periphery thereof;
a shutter driving piston of said shutter driver is provided on a lateral side of said shutter accommodation room;
said shutter driving piston is connected to said shutter ring;
said shutter is movable along said exhaust passage barrel in a non-contact state with said shutter accommodation room by said shutter driving piston that operates along said exhaust passage barrel.

2. The vacuum gate valve according to claim 1, wherein said stationary seal, said shutter sealing, said first gate seal, and said second gate seal are arranged lengthwise along said exhaust passage barrel and on the same plane in said shuttering movement room.

3. The vacuum gate valve according to claim 1, said shutter-ring and said shutter are mutually detachable.

4. The vacuum gate valve according to claim 1, wherein said gating-member driver and said shutter driver are driven by one pair of a driving source and a driving power switching device; and a control device is provided so that said shutter will be controlled to be moved when said gating-member retreats into said gating-member retreat room.

5. The vacuum gate valve according to claim 1, wherein said gating-member retreat accommodation is formed in a case-like-shape and integrated into one body with said main body on the lateral side of said main body in a detachable manner; said gating-member is a pendulum style gating-member; and
the gating-member swings in said gating-member retreat accommodation and said shuttering movement room.

6. A method of the opening and closing of a vacuum gate valve, which is comprised of a main body that has an exhaust passage barrel provided with an exhaust port at the end thereof,
- a gating-member retreat accommodation that has a gating-member retreat room,
- a gating-member that moves from said gating-member retreat room to said exhaust passage barrel so as to shut said exhaust port and so as to be accommodated in said gating-member retreat room,
- a gating-member driver for moving said gating-member,
- a shutter provided movably along said exhaust passage barrel in a shuttering movement room,
- a shutter driver that moves said shutter, wherein
- said main body has an entrance aperture of said gating-member retreat room that communicates with said exhaust port thereon formed facing the lateral side of said exhaust passage barrel;
- said shutter shuts said entrance aperture of said gating-member retreat room at the time when said gating-member shuts said exhaust port and when said gating-member moves into said gating-member retreat room for retreat;
- said shutter has a shutter-ring having a shutter sealing that is touchable with a stationary seal provided on a fitting seat formed on said exhaust port, and is installed so as to confront said stationary seal;
- an end of said shutter on an inner sleeve side thereof is formed so as to protrude lengthwise beyond said shutter-ring;
- said gating-member is made movable in a shuttering movement room located between said gating-member retreat room and said exhaust passage barrel;
- a first gate seal is formed on one side of said gating-member confronting said stationary seal; and
- a second gate seal is formed on the opposite side of said first gate seal confronting said shutter sealing, wherein the method comprises:

accommodating said gating-member in said gating-member retreat room;

moving said shutter lengthwise along said exhaust passage barrel;

making said shutter sealing of said shutter-ring being moved to contact with said stationary sealing;

and thereby establishing, on said exhaust barrel side of said shutter-ring, the shutting of said entrance aperture of said gating-member retreat room by said shutter; and further comprises:

moving said gating-member from said gating-member retreat room to said exhaust passage barrel;

making said first gate seal to contact with said stationary seal to shut said exhaust port;

moving said shutter lengthwise along said exhaust passage barrel;

making said shutter sealing of said shutter ring being moved to contact with said second shutter sealing; and thereby establishing shutting said entrance aperture of said gating-member retreat room by said shutter.

7. The method of the opening and closing of a gate of the vacuum gate valve according to claim 6, wherein said shutter sealing, said first gate seal, and said second gate seal move on the same plane along the length of said exhaust passage barrel against said stationary seal.

\* \* \* \* \*